United States Patent
Haensgen et al.

(10) Patent No.: US 6,348,800 B1
(45) Date of Patent: *Feb. 19, 2002

(54) MULTI-PHASE GROUND FAULT CURRENT SENSOR SYSTEM

(75) Inventors: Steven T. Haensgen, Oak Creek; Jeffrey R. Annis, Waukesha, both of WI (US)

(73) Assignee: Rockwell Automation Technologies, Inc., Mayfield Heights, OH (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/407,661

(22) Filed: Sep. 28, 1999

(51) Int. Cl.[7] ............................................. G01R 31/00
(52) U.S. Cl. ..................... 324/500; 324/251; 324/117 H
(58) Field of Search ............................... 324/500, 127, 324/133, 117 H, 225, 251, 509, 510

(56) References Cited

U.S. PATENT DOCUMENTS

| | | | | |
|---|---|---|---|---|
| 4,059,798 A | * | 11/1977 | Dierker et al. | 324/127 |
| 4,414,543 A | * | 11/1983 | Schweitzer, Jr. | 324/127 X |
| 5,041,761 A | * | 8/1991 | Wright et al. | 315/129 |
| 5,146,156 A | * | 9/1992 | Marcel | 324/127 |
| 5,694,103 A | * | 12/1997 | Goodwin et al. | 324/117 H X |

* cited by examiner

Primary Examiner—Glenn W. Brown
Assistant Examiner—T. R. Sundaram
(74) Attorney, Agent, or Firm—Robert Van Someren; Alexander M. Gerasimow; William R. Walbrun

(57) ABSTRACT

A system and method for detecting ground fault currents in multi-phase power systems. The system and method utilize a gapped core having a central opening. The central opening allows the multiple conductors, e.g. three conductors, to pass therethrough as a group. A sensor, such as a Hall generator, is disposed in the gap of the core and provides an output signal when the current flowing through the multi-phase conductor is unbalanced. The signal output is designed to be proportional to the detected ground fault current.

23 Claims, 5 Drawing Sheets

MULTI-PHASE GROUND FAULT CURRENT SENSOR SYSTEM

FIELD OF THE INVENTION

The present invention relates generally to sensors for detecting a ground fault current, and particularly to a multi-phase Hall effect ground fault current sensor for use in multi-phase motor starter applications.

BACKGROUND OF THE INVENTION

Ground fault current sensor systems have many uses and applications for detecting ground fault currents in multi-phase power systems. For example, ground fault current sensors can be utilized in multi-phase motor starter applications.

A three-phase induction motor starter typically consists of a contactor, circuit breaker, and an overload relay. In an exemplary embodiment, power to an electric motor is switched via a three-pole contactor with short circuit protection provided by a circuit breaker or fuses. Motor windings are protected from excessive heating through the use of bi-metal or electronic overload relays. In high impedance applications, ground fault detection and current interruption components are used to protect other electrical and mechanical components, e.g. wiring within the system. Some overload relays provide motor winding overload protection as well as ground fault monitoring and protection.

Common approaches currently utilized for sensing ground fault currents in multi-phase motor starter applications utilize either a core balanced toroid or a vector sum of three separate current sensors, sometimes referred to as a phase summation ground fault method. Each of these methods has certain disadvantages overcome by the present invention.

In the core balanced toroid approach, a core balanced toroid is constructed from a donut-shaped, tape wound core that is spirally wound with a secondary winding. Three power leads for each of the three motor phases are passed through the center of the toroid. Because the currents of a balanced three-phase power supply are 120° out of phase and of equal magnitude, all currents cancel. This results in a secondary winding reading or current of zero. If, on the other hand, current is leaking out of the system in the form of a ground fault, all three currents no longer cancel and a current is induced in the secondary winding. The ground fault current approximately equals the product of the secondary current multiplied by the number of secondary turns in the secondary winding.

The second approach, i.e., the phase summation ground fault method, utilizes separate current sensors for each phase. The separate current sensors may be current transformers or Hall effect sensors. The signals from each of these current sensors are connected to a summation circuit or are vectorally added with the help of a microprocessor or other microelectronics. If the sum of the currents from each current sensor does not equal zero, then a ground fault may exist somewhere in the system.

Each of these approaches has certain disadvantages. Core balanced toroids, for example, typically are large and bulky. A toroid for use with 500 amp currents may have a diameter on the order of 3 to 6 inches, requiring a larger than desirable package for use in applications, such as motor starter application. Additionally, the secondary winding adds cost, and a resistive load must be added. Furthermore, core balanced toroids may have limited operational range and limited accuracy due to offset errors from high balanced currents and local core saturation effects. The core balanced toroid system also may have limited operational frequency range and/or frequency response characteristics. Further, core balanced toroids are not amenable to the use with a gapped core, and thus they can have linearity problems due to material permeability variations.

In the phase summation ground fault approach, each single current transformer has some error in current measurement accuracy. This leads to a combined error from each of the separate sensors because the signals from the independent sensors are added. Because of the additive error, it can be difficult to discern whether a signal is actually a ground fault or merely a cumulative error. Additionally, the turns ratio of a current transformer is selected to optimize the current transformer performance at a specific current level. If the level of ground fault current is significantly lower than this current, it is very difficult to distinguish ground fault currents from electrical noise.

The present invention addresses the various drawbacks of existing systems and methods for detecting ground fault currents in multi-phase systems.

SUMMMARY OF THE INVENTION

The present invention features a ground fault current sensor system for use in multi-phase motor starter applications. The system includes a rectangular core and a magnetic flux sensor. The rectangular core is formed from a plurality of laminations and includes a rectangular opening through which multiple conductors are allowed to pass through. The magnetic flux sensor preferably is a Hall generator disposed in a gap formed in the rectangular core. The sensor is oriented to detect changes in the magnetic flux that are indicative of a ground fault current.

According to another aspect of the invention, a ground fault current sensor system is provided for use in multi-phase power applications. The system includes a core and a magnetic flux sensor. The core includes a conductor opening for receiving three-phase conductors therethrough. Additionally, the core includes a gap disposed therethrough proximate the conductor opening. The magnetic flux sensor, e.g. Hall generator, is located in the gap. This sensor is configured to output a signal upon experiencing a magnetic flux resulting from unbalanced current flow in the three-phase conductors.

According to another aspect of the present invention, a method is provided for detecting ground fault currents. The method includes providing a plurality of conductors for supplying multi-phase power. The method also includes substantially surrounding the plurality of conductors with a gapped core, preferably formed of multiple rectangular laminations. The method further includes disposing a sensor in a gap of the gapped core to detect changes in magnetic flux that result from unbalanced current flow in the plurality of conductors. The core preferably is formed of a high permeability material and grounded for electrical noise immunity.

BRIEF DESCRIPTION OF THE DRAWINGS

The invention will hereafter be described with reference to the accompanying drawings, wherein like reference numerals denote like elements, and.

DETAILED DESCRIPTION OF THE PREFERRED EMBODIMENTS

In many multi-phase power applications, it is desirable to monitor and provide protection against ground fault currents. For example, it is desirable to sense ground fault currents in multi-phase, e.g. three-phase, motor starter applications.

A typical three-phase motor application utilizes a three-phase induction motor starter that may consist of a contactor, circuit breaker, and an overload relay. Power to the motor is switched via a three-pole contactor with short circuit protection provided by a circuit breaker or fuses. Motor windings are protected from excessive heating through the use of bi-metal or electronic overload relays. For high impedance applications, it is desirable to utilize ground fault detection and interruption mechanisms to protect both electrical and mechanical components, such as wiring within the system. The present inventive system utilizes a unique ground fault detection mechanism for use in multi-phase power systems. The unique system is capable of outputting a signal indicative of a ground fault to trigger a current interruption mechanism, such as those commonly employed in such applications.

Figure 1:
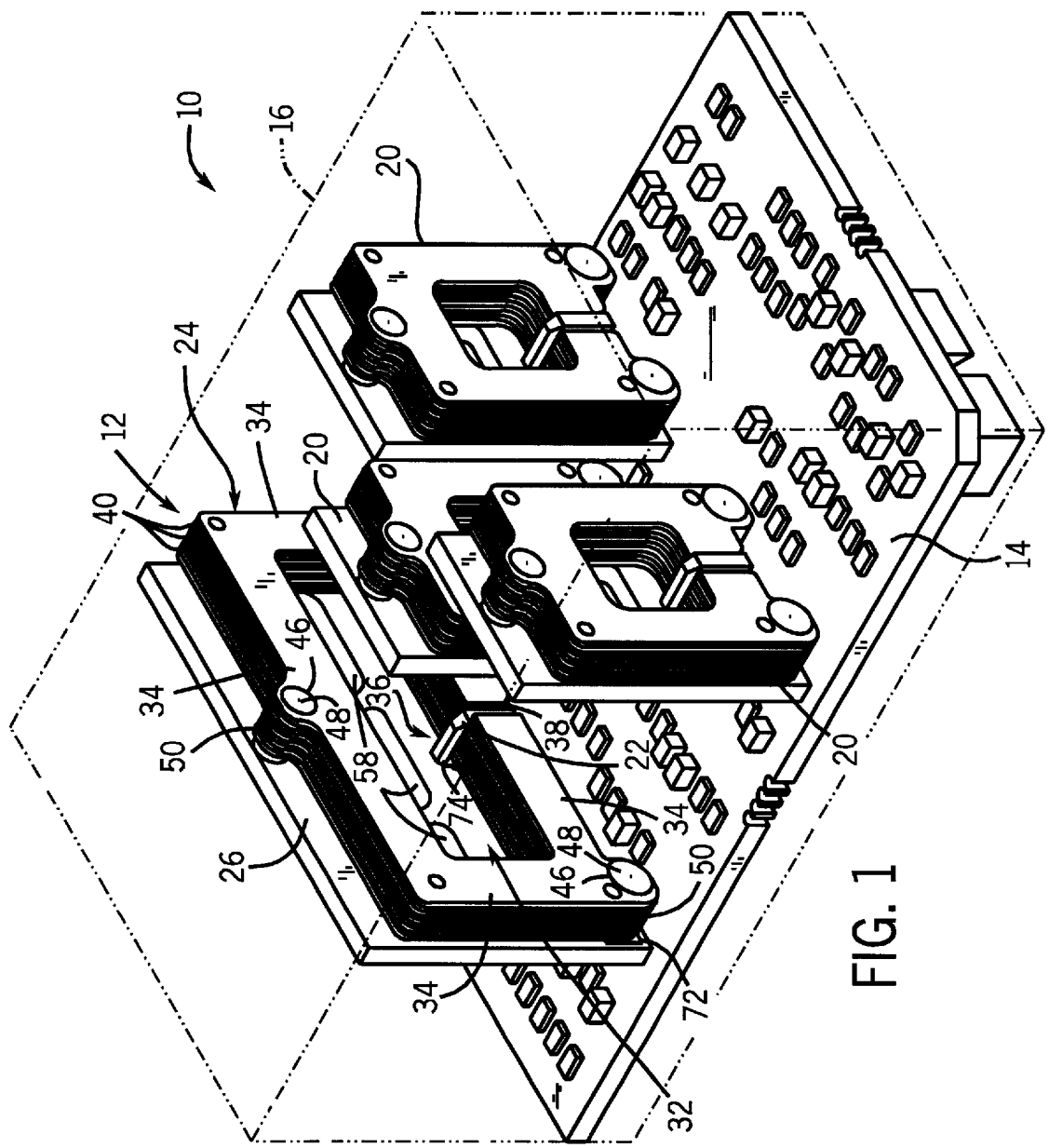
FIG. 1 is a top perspective view of a ground fault current sensor system, according to a preferred embodiment of the present invention.
Figure 2:
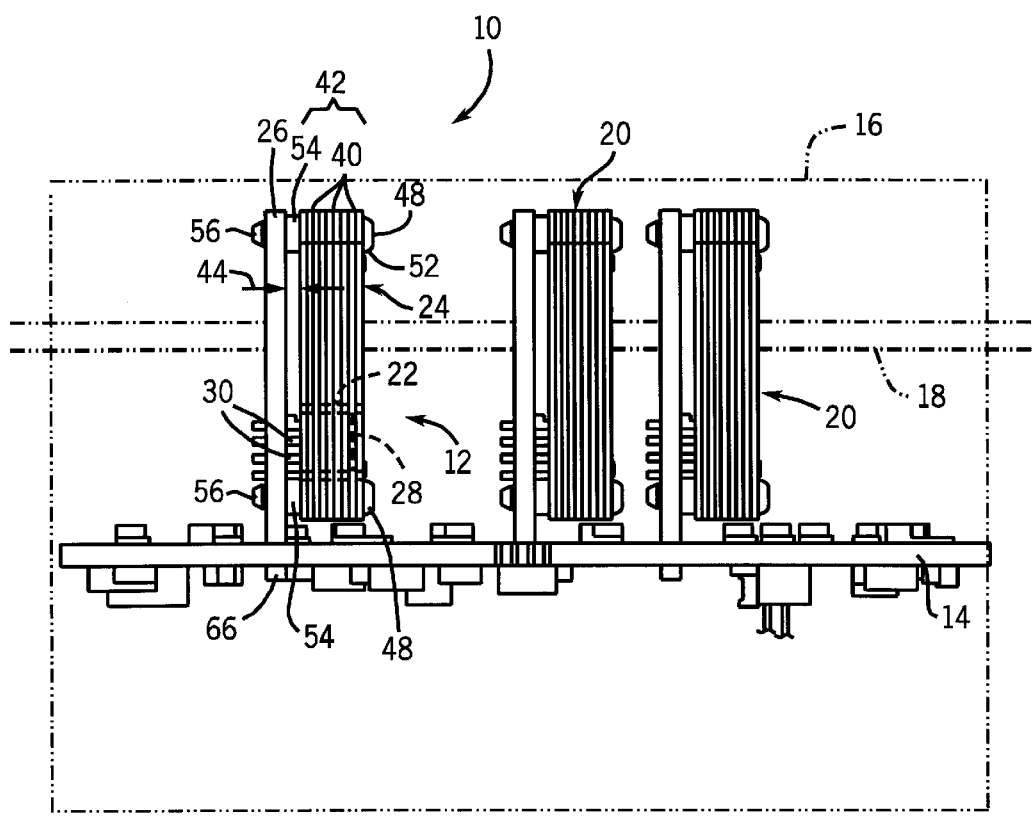
FIG. 2 is a front view of the system illustrated in FIG. 1.
Figure 3:
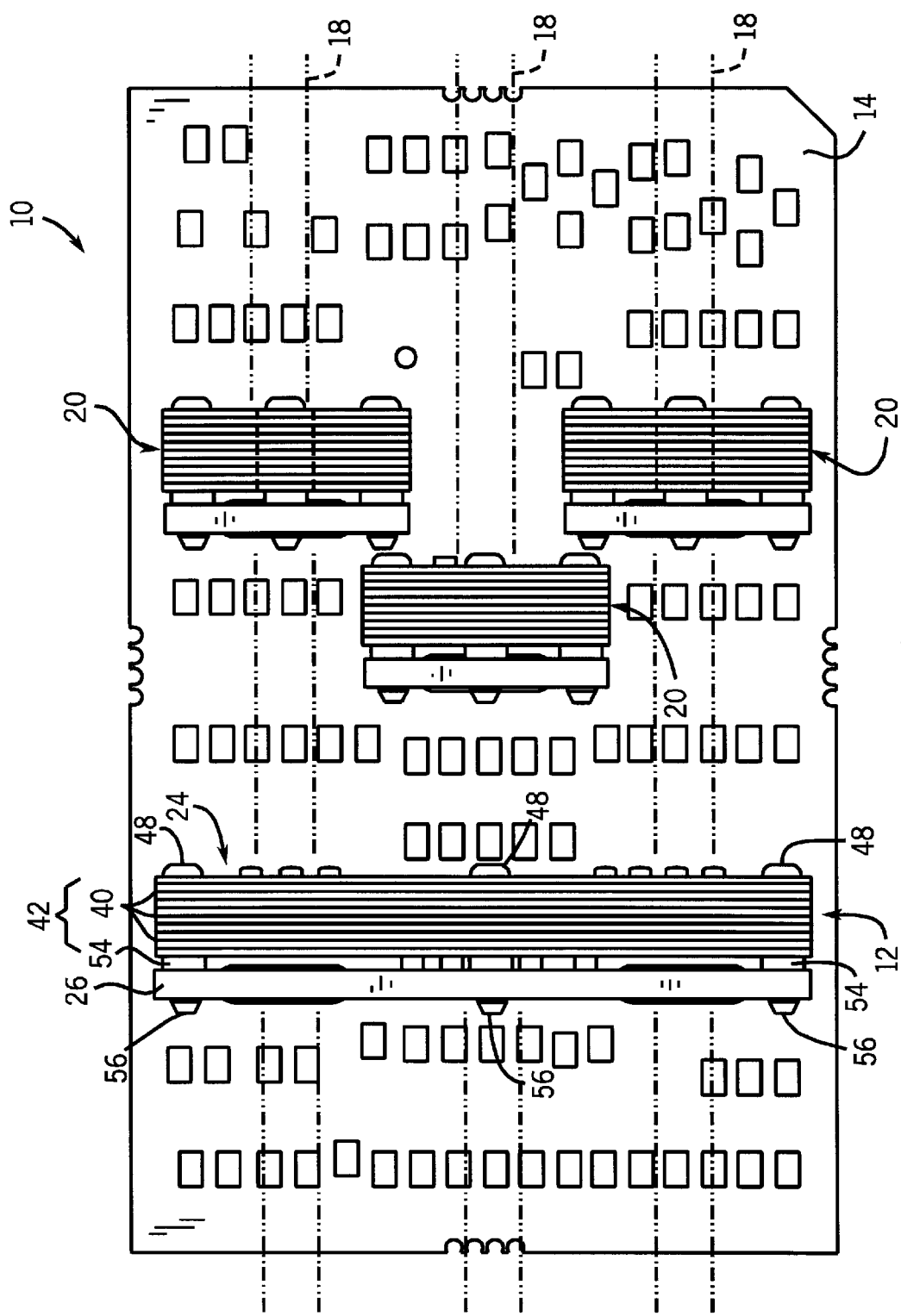
FIG. 3 is a top view of the system illustrated in FIG. 1.

Referring generally to FIGS. 1 through 3, an exemplary embodiment of a ground fault current sensor system 10 is illustrated. A ground fault sensor module 12 is mechanically and electrically connected to a primary printed circuit board 14. Primary printed circuit board 14 may vary according to the specific application of sensor module 12. However, an exemplary primary printed circuit board 14 is of the type utilized in an overload relay 16 (shown in dashed lines) of a three-phase motor starter system.

In the exemplary embodiment illustrated, sensor module 12 is designed for use with a three-phase power system in which three conductors 18 (see FIGS. 2 and 3) provide power to a three-phase induction motor or other powered component. Individual current sensor modules 20 also may be coupled to primary printed circuit board 14 to sense the level and/or changes in the current of individual conductors. Exemplary sensor modules 20 are described in a copending patent application entitled Hall Effect Current Sensing System and assigned to a common assignee. However, sensor system module 12 may be used in a wide variety of applications that do not include modules 20.

In the preferred embodiment, sensor system module 12 includes a magnetic flux sensor 22, such as a Hall generator, a core 24, and a supporting printed circuit board 26 to which sensor 22 and core 24 are mounted. Supporting printed circuit board 26 is electrically and mechanically connected to primary printed circuit board 14, and preferably is oriented generally perpendicular thereto.

Magnetic flux sensor 22 preferably is a Hall generator that includes a Hall plate 28 and a plurality of leads 30 that are connected to supporting printed circuit board 26. Hall generator 22 outputs a signal, and specifically a voltage signal, that corresponds to the magnetic flux in core 24. If the current flowing through the three conductors 18 is balanced, the conductors of the three-phase power supply are 120° out of phase and of equal magnitude. In this normal mode of operation, all currents cancel. If, on the other hand, current is leaking from the system in the form of a ground fault, the three currents do not cancel one another, and a magnetic flux is established in core 24 and across a gap 36. This magnetic flux is sensed by Hall generator 22, and an appropriate signal is output through leads 30 to an appropriate current interrupter mechanism (not shown).

As illustrated, core 24 preferably is formed as a rectangular ring that defines a central opening 32 through which the three conductors 18 extend. Core 24 and central opening 32 are rectangular in shape having four sides 34. Preferably, the lower and upper sides 34 are longer forming an elongate central opening 32 able to accommodate the three conductors 18 along a common plane, as illustrated by dashed lines in FIGS. 2 and 3. The lower side 34 is positioned proximate to the primary printed circuit board 14 is interrupted by the gap 36. Gap 36 is defined by a pair of core ends or core end faces 38 that are generally parallel and face one another across a space, i.e. gap 36, sufficient to receive Hall generator 22 therein.

Preferably, core 24 is formed of a plurality of laminations 40 that are assembled into a lamination stack 42. Laminations 40 preferably are formed from a high permeability nickel-iron material. The use of this high permeability material provides for a minimal magnetomotive force (MMF) drop within the core with a majority of the MMF drop occurring across gap 36 in a linear fashion. Thus, even if the core material permeability varies with flux density, there is little impact on the total sensor MMF drop. This allows sensor module 12 to have very linear operating characteristics over the entire current sensing range.

The lamination stack 42 is mounted to supporting printed circuit board 26. Preferably, core 24 is mounted such that laminations 40 and printed circuit board 26 lie generally parallel to a common plane. Also, lamination stack 42 may be mounted to printed circuit board 26 in a variety of ways, but it preferably is spaced from printed circuit board 26 a predetermined distance indicated by reference numeral 44 in FIG. 2. The space helps prevent the lamination stack 42 from shorting the Hall generator 22 to solder pads on the printed circuit board 26, and from wearing the solder mask. The space also facilitates centering of the Hall plate 28 within the core gap.

In the illustrated embodiment, lamination stack 42 includes a plurality of openings 46 for receiving mounting pins or rivets 48 therethrough. For example, three pins 48 may be used to hold lamination stack 42 to printed circuit board 26. The lamination stack may be designed with protruding bosses 50 in which openings 46 are formed.

Each pin 48 maintains lamination stack 42 between a head 52 and a shoulder 54 formed as part of pin 48. In each pin 48, shoulders 54 are disposed between head 52 and a distal end 56. Distal ends 56 are designed for insertion into and through supporting printed circuit board 26 such that shoulders 54 are sandwiched between lamination stack 42 and supporting printed circuit board 26. Shoulders 54 maintain predetermined distance 44.

Figure 5:
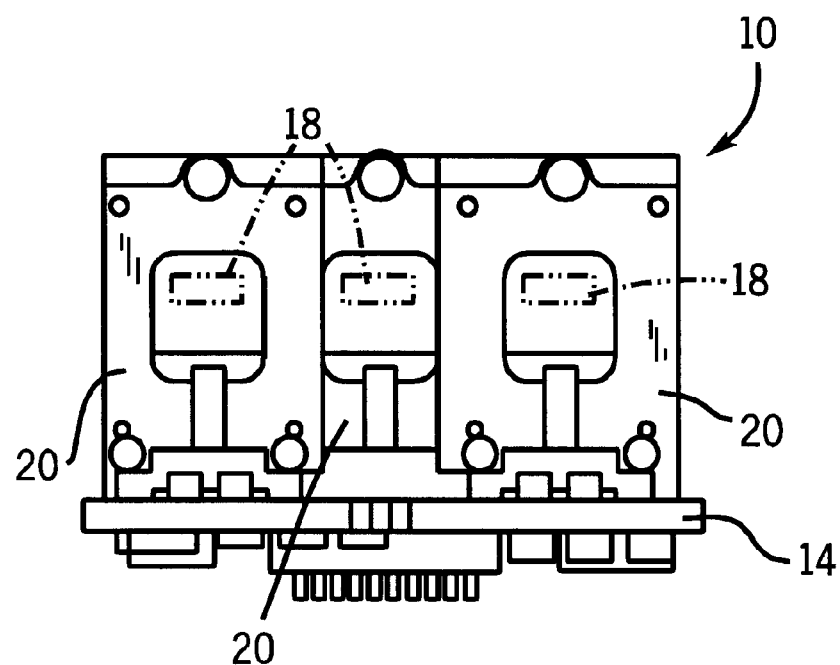
FIG. 5 is an end view taken from the right side of the system illustrated in FIG. 1.
Figure 6:
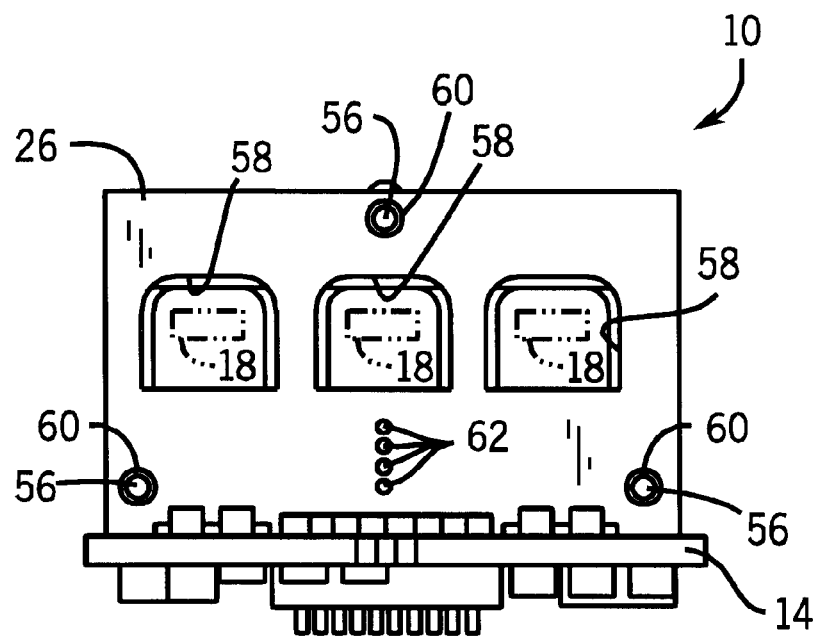
FIG. 6 is an end view taken from the left side of the system illustrated in FIG. 1.

Supporting printed circuit board 26 is generally sized to accommodate lamination stack 42 and includes at least one conductor opening 58 that is generally aligned with central opening 32 of core 24. Preferably, circuit board 26 includes three openings to accommodate each of the three conductors 18 that extend therethrough. (See FIGS. 5 and 6). This allows conductors 18 to freely pass through central opening 32 of core 24 and conductor openings 58 of circuit board 26 without contacting either component. As illustrated, printed circuit board 26 generally is perpendicular to primary printed circuit board 14, and conductors 18 extend generally parallel with primary printed circuit board 14 as they pass sequentially through openings 32 and 58.

Circuit board 26 further includes a plurality of apertures 60 for receiving distal ends 56 of pins 48. Distal ends 56 may be secured within apertures 60 by bonding, soldering or other techniques known to those of ordinary skill in the art. Printed circuit board 26 also includes a plurality of receptacles 62 for receiving leads 30 of sensor 22 to form an electrical connection between circuit board 26 and sensor, e.g. Hall generator 22. It should be noted that receptacle 62 may take other forms, such as pads.

Figure 4:
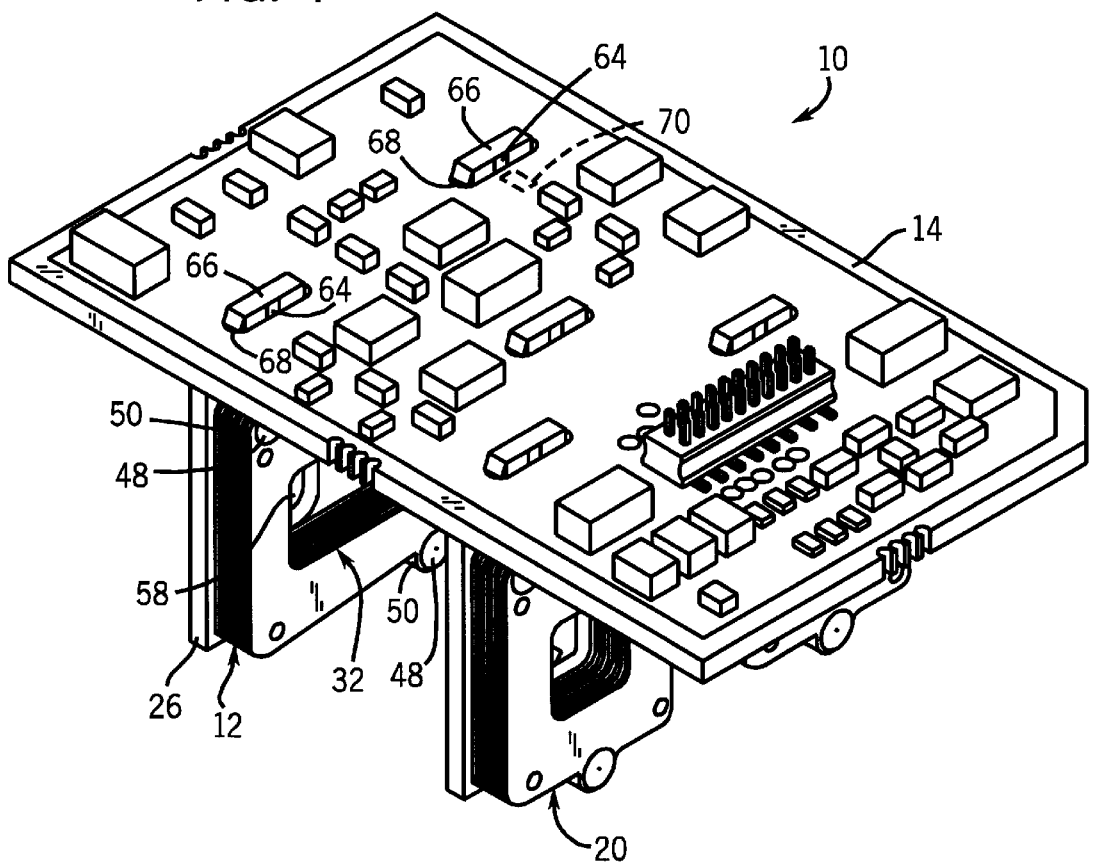
FIG. 4 is a bottom perspective view of the system illustrated in FIG. 1.

Additionally, supporting printed circuit board 26 includes a plurality of pads 64, best viewed in FIG. 4, by which leads 30 are electrically connected to primary printed circuit board 14. Leads 30 are connected to pads 64 through appropriate traces/circuits contained in supporting circuit board 26, as would be known to those of ordinary skill in the art.

Pads 64 preferably are disposed on respective circuit board tabs 66 that extend outwardly for engagement with primary printed circuit board 14. In the preferred embodiment, primary printed circuit board 14 includes corresponding openings 68 designed to matingly receive tabs 66. The intersection of tabs 66 and openings 68 creates a mechanical connection that maintains supporting circuit board 26 in a generally perpendicular orientation with respect to primary printed circuit board 14. Preferably, the base of each tab 66 is disposed at a predetermined distance from core 24 to maintain core 24 spaced from primary printed circuit board 14. This space or distance is best viewed in FIG. 2 and helps avoid mechanical and electrical interference from components mounted on board 14.

Pads 64 are soldered to appropriate pads or connectors disposed in primary printed circuit board 14 to form the electrical coupling between the two circuit boards. This type of connection is commonly referred to as a board-in-board connection by which the two circuit boards may be mechanically and electrically connected to one another. The board-in-board arrangement provides a secure and durable connection even when sensor system 10 is utilized in relatively harsh, industrial environments where it may be subjected to substantial vibration.

The arrangement of components in the core balanced ground fault sensor system 10 is selected to minimize electrical noise that can effect the signal output by the magnetic flux sensor, and specifically Hall generator 22. The arrangement of components is also designed to provide a sturdy package for use in a wide variety of industrial applications. The effects of electrical noise on conductors 18 is reduced or eliminated by electrically connecting core 24 to a ground 70 (see FIGS. 1 and 4). Ground 70 can either be a protective "earth" ground or a circuit ground. For example, core 24 may be grounded through one of the mounting pins 48 which, in turn, is electrically connected to ground 70 via a trace 72 disposed on circuit board 26 and connected to ground 70 through one of the pads 64.

The grounding of core 24 has no detrimental effects with respect to the magnetic properties or characteristics of the core 24. However, the grounding substantially reduces or eliminates the effects of electrical noise that can be capacitively coupled from conductors 18 to a floating core, such as core 24.

Furthermore, if a Hall generator is utilized as sensor 22, Hall plate 28 is positioned such that Hall generator 22 is relatively immune from direct electrical noise on conductors 18 or on primary printed circuit board 14. This is accomplished by positioning Hall plate 28 in a generally perpendicular orientation with respect to the electrical fields radiated from conductors 18 towards Hall generator 22, as best viewed in FIG. 5. Preferably, Hall plate 28 also is disposed generally perpendicular to primary printed circuit board 14, and thus is less influenced by electrical fields created at various components mounted on primary printed circuit 14.

The accuracy of the voltage signal output through leads 30 is enhanced by properly locating Hall plate 28 with respect to core end surfaces 38. For example, Hall plate 28 is axially centered with respect to surfaces 38, as illustrated in FIG. 2. Similarly, Hall plate 28 is vertically centered with respect to surfaces 38, as illustrated best in FIG. 5.

In an exemplary operation, three-phase power is supplied by the three conductors 18. Normally, the currents on conductors 18 are balanced; that is they are 120° out of phase and of equal magnitude. Thus, the currents cancel one another, resulting in little or no magnetic flux across gap 36 and no appreciable voltage signal output by Hall generator 22.

If the magnitude or phase of one or more of the conductors 18 changes, the three-phase power supply is no longer balanced and a magnetic flux is created in core 24 across gap 36. This magnetic flux is sensed by sensor 22, and a signal is output through leads 30. The unbalanced situation often is created by a ground fault current that reduces the magnitude of current carried by one or more of the conductors 18. As described above, this causes sensor 22, e.g. Hall generator 22, to output a signal to an appropriate mechanism for interrupting the current, as is understood by those of ordinary skill in the art.

The unique design of sensor system 10 provides a very accurate ground fault sensor that is much more compact in size than conventional technologies. The design also provides a durable system that readily may be used in a wide variety of industrial environments. Depending on the specific application of sensor module 12, the design of core 24 may be adjusted. For example, the size and shape of core 24 may be adapted. Additionally, features may be added to core 24 to facilitate assembly and use. For example, the core laminations 40 may be formed with and held together by interlocking dimples. Additionally, surfaces 38 that define gap 36 may include a rounded or beveled lead edge 74 to facilitate easy insertion of core 24 over sensor 22 during assembly.

It will be understood that the foregoing description is of preferred exemplary embodiments of this invention and that the invention is not limited to the specific forms shown. For example, the materials utilized in forming the conductor, the core and the circuit boards may be varied depending on the specific application; a wide variety of primary printed circuit boards may be utilized depending on the specific application and environment in which the system is utilized; and the sensor systems may be combined with a variety of other features within a given component. It should further be noted that the use of locational terminology, such as upper, lower, rear, front, top and bottom are merely for descriptive purposes and should not be construed as limiting with respect to the orientation of the components described. These and other modifications may be made in the design and arrangement of the elements described above without departing from the scope of the invention as expressed in the appended claims.

What is claimed is:

1. A ground fault current sensor system for use in multi-phase motor starter applications, comprising:
a printed circuit board having at least one opening;
a core formed from a plurality of laminations mounted on and substantially parallel to the printed circuit board, the core having an opening through which a plurality of conductors extend without contacting the core, each conductor extending through one of the at least one opening in the printed circuit board without contacting the printed circuit board; and
a magnetic flux sensor disposed proximate the core, the magnetic flux sensor being oriented to detect changes in the magnetic flux that are indicative of a ground fault current, wherein the core includes a gap formed through the plurality of laminations, the magnetic flux sensor being positioned in the gap between a pair of core ends such that a distance is provided between the magnetic flux sensor and each core end.

2. The ground fault current sensor system as recited in claim 1, wherein the at least one opening of the printed circuit board comprises a plurality of openings, each of the plurality of conductors corresponding to and extending through one of the plurality of openings of the printed circuit board.

3. The ground fault current sensor system as recited in claim 1, wherein the magnetic flux sensor comprises a Hall effect generator mounted on the printed circuit board.

4. The ground fault current sensor system as recited in claim 1, further comprising at least one secondary core having an opening through which one of the plurality of conductors sequentially extends.

5. The ground fault current sensor system as recited in claim 1, wherein the printed circuit board is electrically and mechanically connected to a primary printed circuit board via a board-in-board connection.

6. The ground fault current sensor system as recited in claim 4, wherein the at least one secondary core comprises a plurality of secondary cores, each conductor having a corresponding secondary core through which it sequentially extends.

7. The ground fault current sensor system as recited in claim 1, wherein the core is electrically grounded.

8. The ground fault current sensor system as recited in claim 2, wherein the plurality of conductors comprise three conductors for each phase of a three-phase power supply and wherein the plurality of openings comprise three openings, each conductor disposed through a corresponding opening of the printed circuit board.

9. The ground fault current sensor system as recited in claim 1, wherein the plurality of conductors are disposed through the opening of the core in a common plane.

10. A ground fault current sensor system for use in multi-phase power applications, comprising:
a core having a conductor opening for receiving three-phase conductors therethrough and a gap disposed through the core; and
a magnetic flux sensor located in the gap, the magnetic flux sensor being configured to output a signal upon experiencing a magnetic flux resulting from unbalanced current flow in the three-phase conductors, wherein the core and the magnetic flux sensor are mounted to a printed circuit board having at least one hole to receive the three-phase conductors therethrough.

11. The ground fault current sensor system as recited in claim 10, wherein the core is substantially parallel to the printed circuit board.

12. The ground fault current sensor system as recited in claim 11, wherein the printed circuit board is substantially perpendicular to and mounted on a primary printed circuit board by a board-in-board connection.

13. The ground fault current sensor system as recited in claim 10, further comprising at least one secondary core through which at least one of the three-phase conductors extends.

14. The ground fault current sensor system as recited in claim 10, wherein the core is electrically grounded.

15. The ground fault current sensor system as recited in claim 10, wherein the three-phase conductors comprise three conductors and wherein the at least one hole comprises three holes, each conductor extending through a corresponding hole without contacting the printed circuit board and without contacting the core.

16. The ground fault current sensor system as recited in claim 10, wherein the three-phase conductors extend through the conductor opening of the core in a common plane.

17. A method for providing ground fault current detection, comprising:
providing a plurality of conductors for supplying multi-phase power;
substantially surrounding the plurality of conductors with a core and a printed circuit board, the core having a gap formed by a pair of facing core ends, and the core being mounted on and substantially parallel to the printed circuit board; and
disposing a Hall generator in the gap, the Hall generator being mounted on the printed circuit board.

18. The method as recited in claim 17, wherein substantially surrounding comprises substantially surrounding the plurality of conductors with the core and the printed circuit board such that the core and the printed circuit board do not contact the plurality of conductors.

19. The method as recited in claim 17, further comprising substantially surrounding at least one of the plurality of conductors with a secondary core.

20. The method as recited in claim 17, wherein providing comprises providing three conductors in proximity to each other for supplying three-phase power.

21. The method as recited in claim 20, wherein providing further comprises providing the three conductors in a common plane.

22. The method as recited in claim 19, wherein substantially surrounding at least one of the plurality of conductors comprises substantially surrounding the plurality of conductors with a plurality of secondary cores, each conductor being surrounded by one corresponding secondary core.

23. The method as recited in claim 17, further comprising inserting the printed circuit board into a primary circuit board via a board-in-board connection that both electrically and mechanically connects the printed circuit board and the primary circuit board.

* * * * *